United States Patent [19]
Wuu et al.

[11] Patent Number: 5,731,232
[45] Date of Patent: Mar. 24, 1998

[54] METHOD FOR CONCURRENTLY MAKING THIN-FILM-TRANSISTOR (TFT) GATE ELECTRODES AND OHMIC CONTACTS AT P/N JUNCTIONS FOR TFT-STATIC RANDOM

[75] Inventors: Shou-Gwo Wuu, Chu-Tong; Mong-Song Liang, Hsin-chu, both of Taiwan

[73] Assignee: Taiwan Semiconductor Manufacturing Company, Ltd., Hsin-Chu, Taiwan

[21] Appl. No.: 745,639

[22] Filed: Nov. 8, 1996

[51] Int. Cl.$^6$ .................... H01L 21/00; H01L 21/84
[52] U.S. Cl. .................. 438/153; 438/154; 438/621; 257/903
[58] Field of Search ........................ 438/153, 154, 438/621; 257/903

[56] References Cited

U.S. PATENT DOCUMENTS

| | | | |
|---|---|---|---|
| 5,393,682 | 2/1995 | Liu | 438/152 |
| 5,403,762 | 4/1995 | Takemura | 437/40 |
| 5,468,662 | 11/1995 | Havemann | 437/40 |
| 5,545,584 | 8/1996 | Wuu et al. | 438/152 |
| 5,652,174 | 7/1997 | Wuu et al. | 438/152 |

FOREIGN PATENT DOCUMENTS 0301571  7/1988  European Pat. Off.

*Primary Examiner*—John Niebling
*Assistant Examiner*—David A. Zarneke
*Attorney, Agent, or Firm*—George O. Saile; Stephen B. Ackerman

[57] ABSTRACT

A method is achieved for making TFT-load static random access memory (SRAM) cells where the thin film transistor (TFT) gate electrodes are made from an electrical conductor. At the same time, portions of the conductor between P and N doped polysilicon interconnections eliminate the P/N junction. Ohmic contacts are formed while avoiding additional processing steps. N-channel FET gate electrodes are formed from an $N^+$ doped first polysilicon layer having a first insulating layer thereon. Second polySi interconnections are formed with a second insulating layer thereon. First contact openings are etched in the first and second insulating layers to the $N^+$ doped FET gate electrodes, and a patterned conductor (TiN, $TiSi_2$) forms the P-channel TFT gate electrodes and concurrently forms portions over and in the first contact openings. A TFT gate oxide is formed and second contact openings are etched over the first contact openings to the conductor. An $N^-$ doped third polySi layer is deposited, selectively doped $P^+$ and patterned to form the TFT $N^-$ doped channel, the $P^+$ doped source/drains, and the interconnection in the contact openings to the N-FET gate electrodes. The conductor at the interface between the P/N polySi forms essentially ohmic contacts, thereby eliminating the P/N junction and improving circuit performance.

27 Claims, 4 Drawing Sheets

METHOD FOR CONCURRENTLY MAKING THIN-FILM-TRANSISTOR (TFT) GATE ELECTRODES AND OHMIC CONTACTS AT P/N JUNCTIONS FOR TFT-STATIC RANDOM

BACKGROUND OF THE INVENTION

(1) Field of the Invention

The present invention relates to integrated circuits on semiconductor substrates, and more particularly to a method of fabricating Thin Film Transistors (TFTs) and concurrently providing low-resistance ohmic contacts at P/N junctions between the TFT-load and storage nodes on TFT-load Static Random Access Memory (SRAM).

(2) Description of the Prior Art

Dynamic Random Access Memory (DRAM) and Static Random Access Memory (SRAM) circuits are used extensively in the electronics industry for storing data for digital systems, such as computers. The SRAM is much faster than the DRAM circuit. Because of its speed the SRAM is ideal for use as a cache or buffer memory to speed up the system performance, and is therefore preferred over the DRAM device. Each of the memory cells on an SRAM device is usually composed of six transistors and functions as a static latch or flip-flop circuit, and does not have to be refreshed like a DRAM cell. Unfortunately, the SRAM devices require more processing steps than the DRAM and are therefore less cost effective to manufacture.

A circuit schematic for a typical six-transistor CMOS SRAM cell is shown in FIG. 1. Only one of the array of many cells is shown in FIG. 1. The trend in recent years is to fabricate the CMOS SRAMs using P channel Thin Film Transistors (TFTs) for the load transistors, labeled P1 and P2 in FIG. 1, and to use N-channel FETs formed in and on the substrate as the driver transistors, labeled N1 and N2. The N-channel FETs are also used as the pass transistors, and labeled WN1 and WN2 in FIG. 1.

Briefly, the SRAM circuit functions as follows. Address row and column decoder circuits on the periphery of the SRAM chip (not shown) select a memory cell. Referring to FIG. 1, the applied gate voltage on the word line WL switches on the pass transistors WN1 and WN2. The voltage at the nodes Q1 and Q2 between the two pairs of CMOS transistors P1, N1 and P2, N2 is sensed on the bit lines BL1 and BL2 during the read cycle to determine the state of the SRAM latch. During the write cycle, when the write circuit (not shown) is enabled, an impressed voltage on the bit lines can switch the voltage levels on the latch, and thereby can switch the state of the cell that stored the binary data representing the ones and zeros.

Typically during the fabrication of the SRAM circuit on a semiconductor substrate, several layers of patterned conductively doped amorphous or polysilicon films are used to form parts of the N- and P-channel transistors and the inter- and intralevel connections. The polysilicon layers are separated and electrically insulated from each other by dielectric layers, such as silicon oxide. These various electrically conducting polysilicon layers and portions of the substrate are then interconnected by forming contact openings in the insulating layers between the various polysilicon layers, such as by photoresist masking and etching. Typically, the conventional SRAM cell requires a large number of masking and etching steps that includes the patterning of about four polysilicon layers, and about five masking and etching steps to form the contact openings between the polysilicon layers and to the substrate. Therefore, there is a very strong need in the semiconductor industry to minimize the number of processing steps while providing the fastest switching SRAM circuits.

One concern with the conventional SRAM cell is the non-ohmic stacked contacts that are formed in the contact openings, and that occur at interfaces between polysilicon layers having different types of conductive dopants ($P^{30}/N^+$). These $P^+/N^+$ diode-like junctions delay the on current ($I_{on}$) during switching and degrade the performance of the SRAM cell.

In recent years several methods have been described for fabricating improved SRAM-Thin Film Transistor (TFT). For example, Y. Takemura, U.S. Pat. No. 5,403,762 describes a method for making only P-channel TFTs on insulating substrates for driving optical devices, such as TFTs on liquid crystal displays. However, Takemura does not address the need for making low-resistance ohmic contact between $P^+/N^+$ junctions that occur on SRAMs when building both N-channel and P-channel FETs. Another method directed to the formation of an array of thin film transistors on an insulating substrate for an active matrix liquid crystal display is described by H. Tanaka in European patent application EP 0 301 571A2. Tanaka's method utilizes a double metal electrode formed on the insulating substrate. The bottom metal has a high electrical conductivity, such as aluminum, and the top metal is a good anodizing metal, such as tantalum (Ta). The Ta is then anodized and a silicon nitride layer is deposited. The channel and source/drains of the TFT are then formed by doping and patterning a polysilicon layer. However, the method does not address the formation of a P-TFT and N-channel FET, nor a method for making at the same time an ohmic contact. A more closely related method for making N-channel FETs in the substrate and P-channel TFTs on the adjacent field oxide regions is described by R. H. Havemann, U.S. Pat. No. 5,468,662. In this patent, since the P-TFT is made adjacent to the N-FET, additional space is required, and the packing density is less than SRAM structures in which the P-TFT is fabricated over other N-channel FETs. The method also uses a titanium silicide to interconnect the gate of the P-channel TFT with the source or drain of the N-channel FET formed in and on the silicon substrate. The silicide interconnection is formed by depositing and patterning a polysilicon layer over the titanium, sintering to selectively form a titanium silicide ($TiSi_2$), and then the unreacted Ti metal is removed, similar to the well known salicide process, to form the $TiSi_2$ gate on the TFT and the silicided source/drain on the N-channel FET.

Therefore, there is still a strong need in the semiconductor industry for making SRAM devices having high packing density with the least number of processing steps while eliminating the P/N junctions between oppositely doped polysilicon layers.

SUMMARY OF THE INVENTION

It is a principal object of the present invention to provide a thin-film-transistor (TFT) static random access memory (SRAM) device having high packing density and improved performance.

It is another object of this invention to modify the P/N junctions between oppositely doped polysilicon layers, thereby forming ohmic contacts having low resistance.

It is still another object of this invention to more specifically modify the P/N junction so as to form an ohmic contact between the thin film load and storage node in the TFT-load SRAM cell while forming at the same time a high conducting thin film gate electrode.

In accordance with the objects of this invention, a method is described for fabricating an array of SRAM cells having P-channel thin film transistors (P-TFT) in which a patterned high electrically conducting layer is used to form gate electrodes for the P-TFTs. At the same processing step for forming the P-TFT gate electrode from portions of the conducting layer, the patterned conducting layer is used in the contact openings to provide low-resistance ohmic contacts between $P^+$ and $N^+$ polysilicon layers. This method eliminates extra process steps, and therefore minimizes manufacturing cost while providing SRAM circuits with improved performance.

The method starts by providing a $P^-$ (boron) doped single crystal semiconductor substrate having device areas on the substrate surface that are electrically isolated from each other by Field OXide (FOX) areas. A thin gate oxide is then formed on the device areas by thermal oxidation. An $N^+$ doped first polysilicon layer and a cap insulating layer, such as silicon oxide ($SiO_2$), is deposited, and patterned by photoresist masking and plasma etching to form the gate electrodes for N-channel field effect transistors (FETs) for the pass transistors and the driver transistors of the SRAM circuit on the device areas. The first polysilicon layer also forms portions of the intraconnecting word lines for the pass transistors. Lightly doped $N^-$ source/drain areas are then formed in the device areas adjacent to the gate electrodes by ion implantation. A conformal insulating layer composed, for example, of silicon oxide is deposited on the substrate, and anisotropically etched back to the cap oxide layer forming insulating sidewall spacers on the sidewalls of the gate electrodes. $N^+$ doped source/drain contact areas are then formed adjacent to the sidewall spacers by another ion implantation, thereby completing the N-channel FETs.

The P-channel FETs for the SRAM latch circuit and the ohmic contacts between the $P^+$ and $N^+$ patterned polysilicon layers are formed next. The process continues by depositing a blanket first insulating layer composed, for example, of silicon oxide on the N-channel FETs and elsewhere on the substrate. A second doped polysilicon layer is then deposited and patterned to provide the electrically conducting patterns that are later used to form portions of the SRAM circuit. A second insulating layer is deposited on the patterned second polysilicon layer and elsewhere on the exposed first insulating layer. First contact openings are now etched using a patterned photoresist mask and anisotropic plasma etching to the patterned first polysilicon layer, more specifically to portions of the gate electrodes for the $N^+$ driver in the thin film cell. A blanket conducting layer, such as titanium nitride (TiN), is deposited on the second insulating layer, which is also conformally deposited in the first contact openings. The TiN conducting layer is then patterned to form the gate electrodes for the P-channel TFTs, and at the same time is patterned leaving portions of the conducting layer in the first contact openings. Therefore, by the method of this invention, a low-resistance ohmic contact is made to the $N^+$ first polysilicon layer at the same time that the TFT gate electrode is formed. A blanket third insulating layer is then deposited on the TFT gate electrodes formed from the TiN conducting layer and forms a gate oxide for the TFTs. Using a photoresist mask and plasma etching, second contact openings are now etched in the third insulating layer over portions of the patterned conducting layer that are over and in the first contact openings. An $N^-$ doped third polysilicon layer is deposited over the TFT gate oxide and also in the second contact openings. Using a patterned photoresist mask, the $N^-$ doped third polysilicon layer is selectively implanted with a P-type dopant, such as boron, to form the source/drain areas for the TFTs. The doped third polysilicon layer is then patterned to form the $N^-$ channel regions for the TFTs over the gate electrodes, and is also patterned having $P^+$ doped portions extending over the second contact openings which contact the exposed patterned conducting layer in the first contact openings. By the method of this invention, the electrical contact between the TFT-load and the storage node for the TFT-load SRAM cell, that would otherwise be a P/N junction, is eliminated and replaced with an ohmic contact.

The second embodiment is now described. The process steps for the second embodiment are identical to the first embodiment up to, but not including the conducting layer. In this alternate method, the TFT gate electrode is formed using a substantially different process. Rather than depositing a conducting layer, as in the first embodiment, a third polysilicon layer is deposited and patterned to form the gate electrodes for the TFT, portions of which are also patterned over the first contact openings. The patterned third polysilicon layer is then converted to a silicide by depositing a metal, such as titanium, and annealing to completely consume the polysilicon. The unreacted metal (Ti) over the second insulating layer is then selectively removed by wet etching, such as in ammonium hydroxide ($NH_4OH$). This provides a good electrically conducting TFT gate electrode and a good conducting layer between the $P^-$ and $N^{31}$ doped polysilicon layers in the first contact openings. Now, as in the first embodiment, a third insulating layer is deposited to form a gate oxide over the gate electrodes, and second contact openings are etched in the gate oxide over the silicide in the first contact openings. A fourth $N^-$ doped polysilicon layer (equivalent to the third polysilicon layer in the first embodiment) is deposited and doped with $P^+$ dopant to form the source/drain regions and inter-connections to the second contact openings. The titanium silicide ($TiSi_2$) in the contact openings eliminates the P/N junction, thereby forming a low-resistance ohmic contact. The selective wet etching of the Ti provides a larger processing latitude.

BRIEF DESCRIPTION OF THE DRAWINGS

The objects and other advantages of the invention will become more apparent in the preferred embodiments when read in conjunction with the following drawings.

DESCRIPTION OF THE PREFERRED EMBODIMENTS

The present invention describes an improved method for fabricating arrays of static random access memory (SRAM) cells in which the interconnections of the discrete circuit elements are formed using a novel TFT gate structure formed from an electrically conducting layer, in which portions of the layer are also used to eliminate the P/N junction at the TFT-load and storage node, thereby forming an ohmic contact. The gate electrodes and ohmic contacts are made concurrently, thereby minimizing the number of processing steps. Although the present invention describes a method for making an improved TFT SRAM cell, the electrically conducting layer can also be used to form local interconnections and the peripheral circuits. It should be well understood by those skilled in the art that the method can be equally applied to other semiconductor integrated circuits, and more particularly on other circuits having P-channel TFTs where low-resistance ohmic contacts are also required.

Figure 2:
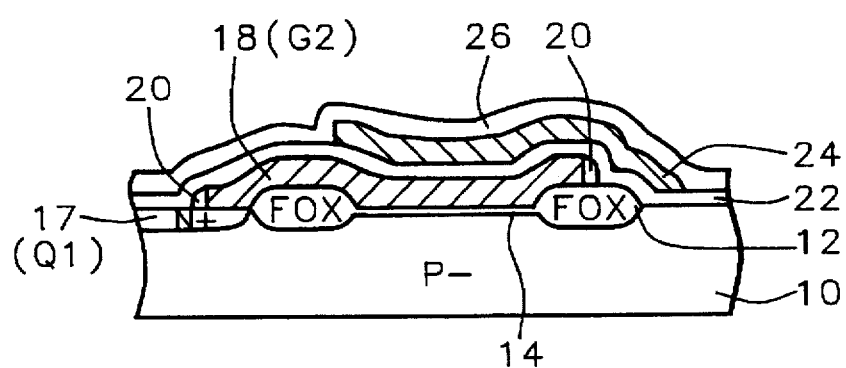
FIGS. 2 through 5 show the process sequence in schematic cross sectional view for building an improved SRAM cell having a P-channel thin-film-transistor gate electrode formed from a good electrically conducting titanium nitride (TiN) layer. Portions of the TiN layer also eliminate the P/N junction between the TFT-load and storage node of the TFT SRAM cell.

Referring now to FIGS. 2 through 5, the method is described for forming the P-channel TFT without P/N junctions during the fabrication of the SRAM device. The SRAM process begins by forming Field OXide (FOX) areas 12 that electrically isolate device areas on a semiconductor substrate 10. The substrate 10 is typically composed of a P doped single crystal silicon on which the SRAM cells are to be built. For practical reasons, only a portion of the SRAM memory cell is shown in FIG. 2. Typically, the field oxide 12 is formed by selective oxidation of the regions around the device areas. For example, the conventional LOCal OXidation of Silicon (LOCOS) process can be used, and the oxide is usually grown to a thickness of between about 4000 and 6000 Angstroms.

Figure 1:
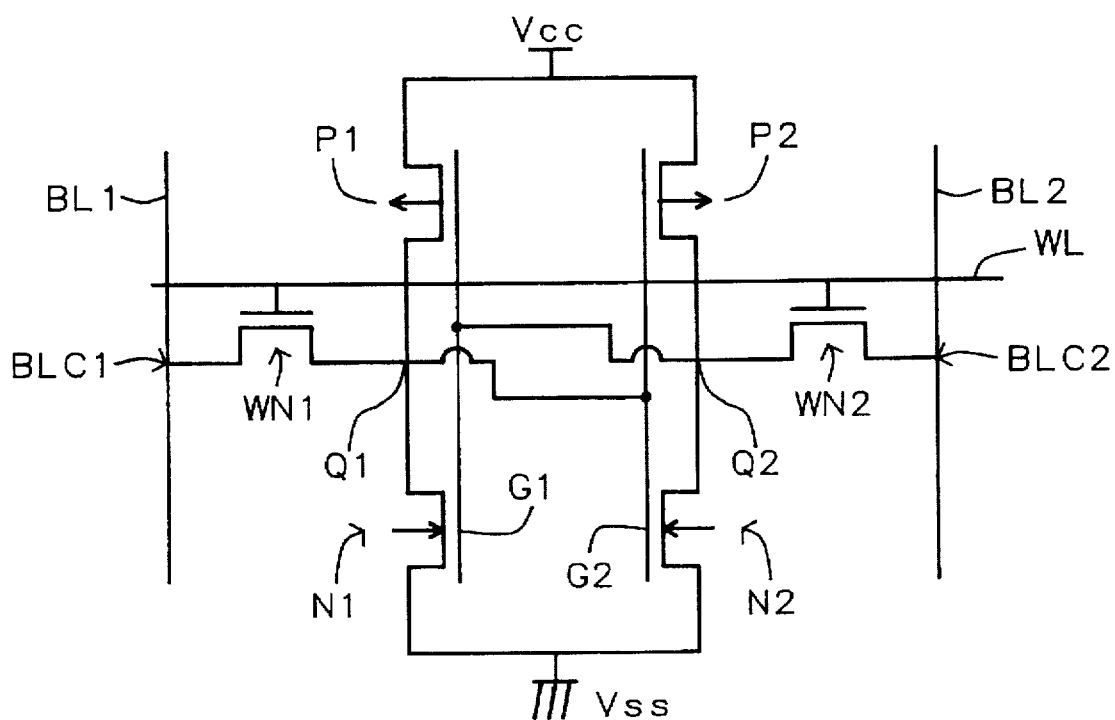
FIG. 1 shows an electrical schematic of a prior art six-transistor SRAM cell.

After forming the field oxide 12, the surface of the device areas is thermally oxidized to form a gate oxide 14. The gate oxide is preferably grown to a thickness of between about 60 and 200 Angstroms. A blanket first polysilicon layer 18 is then deposited by low pressure chemical vapor deposition (LPCVD) using, for example, silane ($SiH_4$) as the reactant gas. Layer 18 is then doped with N-type impurities, for example, by ion implantation or alternatively by in-situ doping with arsenic (As) or phosphorus (P). The dopant concentration in layer 18 is between about 1.0 E 18 to 1.0 E 21 atoms/$cm^3$, and the thickness of layer 18 is between about 1000 and 3500 Angstroms. The first polysilicon layer 18 is then patterned using conventional photolithographic techniques and anisotropic plasma etching to form the gate electrodes 18 for the N-channel FET. The N-FETs are used as the pass transistors (such as WN1), and as the driver transistors (such as N2) for the latch portion of the SRAM circuit, as depicted in the circuit schematic of FIG. 1. Only the driver transistor N2 (FIG. 1) having the gate electrode G2 is depicted in the schematic cross sectional view of FIG. 2. $N^-$ lightly doped drains (LDD) are then formed in the substrate 10 adjacent to the gate electrodes 18, for example by implanting phosphorus ions ($p^{31}$) at a dose of between about 1.0 E 13 and 1.0 E 15 ions/$cm^2$ and at an implant energy of between about 25 and 40 KeV.

Sidewall spacers 20 are formed next by depositing a conformal insulating sidewall layer and anisotropically etching back layer 20 to the surface of the first polysilicon layer 18, thereby forming the spacers 20 on the sidewalls of the gate electrodes 18 (FIG. 2). Since the cross section through the gate electrode 18 is along the channel width as shown in FIG. 2, only portions of the sidewall spacers 20 are depicted along the ends of the gate electrode. The insulating layer 20 is deposited by low pressure chemical vapor deposition (LPCVD) using, for example, tetraethosiloxane (TEOS), and the thickness of layer 20 prior to etch back is between about 1000 and 2000 Angstroms.

The N-channel FETs are now completed by forming the $N^+$ doped source/drain contact areas by ion implanting an N type dopant, such as arsenic or phosphorus. Although the WN1 pass transistor (FIG. 1) is not shown in FIG. 2, a portion of the source/drain implant 17($N^+$) for the pass transistor is shown in FIG. 2. Since the cross section through the driver transistor N2 is along the channel width and does not pass through the source/drain areas, the source/drain areas do not appear in FIG. 2.

Still referring to FIGS. 2 through 5, the method for forming the P-channel TFT and concurrently eliminating the P/N junction at the contact is described. Although, for practical reasons, only one of the TFTs having a TFT-load contact to the gate electrode G2 of the driver N-channel FET and the node contact Q1 is shown, it should be clearly understood that other node contacts (such as Q2 of FIG. 1) are likewise formed, and indeed all the node contacts for the array of SRAMs are formed in like manner during the same processing steps.

Continuing now with the process, a first insulating layer 22 is deposited on the completed N-channel FETs and elsewhere on the substrate. Layer 22 is preferably a silicon oxide ($SiO_2$) deposited at a medium temperature range (650–800° C.) using, for example, LPCVD and a TEOS gas. The preferred thickness of layer 22 is between about 1000 and 3000 Angstroms.

Still referring to FIG. 2, a second polysilicon layer 24 is blanket deposited on the first insulating layer 22. Layer 24 is preferably deposited by LPCVD using, for example, silane ($SiH_4$) similar to the deposition method for the first polysilicon layer 18. Layer 24 is also doped $N^+$ with phosphorus ($p^{31}$) by ion implantation and having a dopant concentration in the range of between about 1.0 E 18 and 1.0 E 21 atoms/$cm^3$, and a thickness in the range of between about 700 and 3000 Angstroms. Second polysilicon layer 24 is then patterned by conventional photolithographic techniques and anisotropic plasma etching to provide the electrically conducting patterns that will later form portions of the SRAM circuit.

As shown in FIG. 2, a second insulating layer 26 is deposited on the patterned second polysilicon layer 24 and elsewhere on the first insulating layer 22. Insulating layer 26 is preferably composed of silicon oxide and is also deposited using LPCVD and a TEOS gas. The thickness of layer 26 is preferably between about 1000 and 2500 Angstroms.

Figure 3:
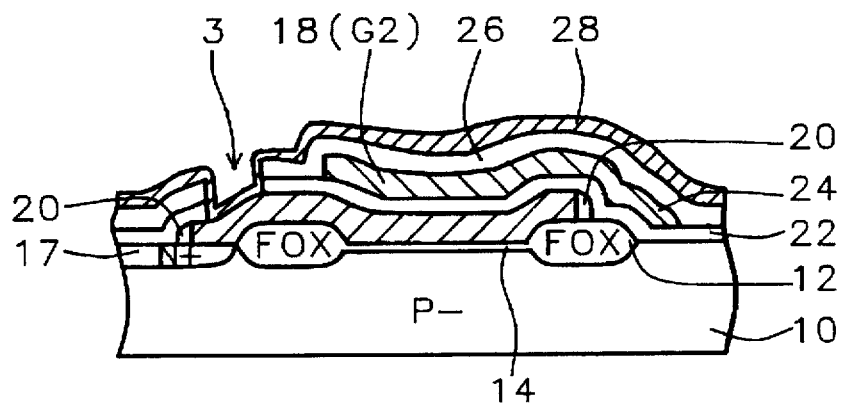

Referring to FIG. 3, first contact openings 3 are formed in the first and second insulating layers 22 and 26 to the surface of the patterned $N^+$ doped first polysilicon layer 18 that forms the gate electrodes 18 for the N-channel FETs that are the driver transistors in the SRAM cell. Conventional photolithographic techniques and anisotropic plasma etching are used to etch the first contact openings. For example, the contacts can be etched using reactive ion etching (RIE) and an etchant gas, which is selective to polysilicon, such as trifluoromethane ($CHF_3$) or carbon tetrafluoride ($CF_4$) and hydrogen ($H_2$).

Still referring to FIG. 3, a good electrically conducting layer 28 is blanket deposited over the second insulating layer 26 and in the first contact openings 3. The interface between the electrically conducting layer 28 and the $N^+$ polysilicon layer 18 provides low contact resistance, thereby providing ohmic contact. Preferably electrically conducting layer 28 is composed of titanium nitride (TiN). For example, the TiN layer can be deposited by sputter deposition from a Ti target in a nitrogen ($N_2$) ambient at low pressures. TiN layer 28 is preferably deposited to a thickness between about 400 and 1000 Angstroms.

Figure 4:
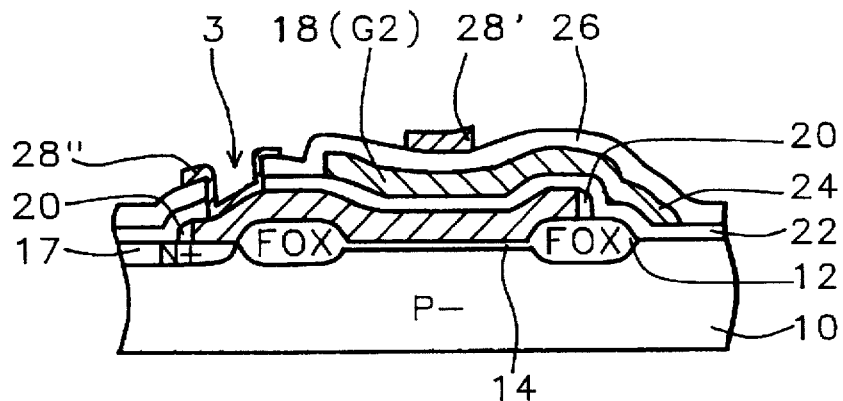

Referring now to FIG. 4, conventional photolithographic and anisotropic plasma etching are used to pattern conducting layer 28 to form the gate electrodes 28' for the P-channel TFTs. An important advantage of this invention is that portions 28" of conducting layer 28 are patterned at the same time over the first contact openings 3 to form low-resistance ohmic contacts between the $N^+$ doped polysilicon layer 18 and a subsequent $P^+$ doped polysilicon layer to be deposited in a later processing step. Portions of the patterned TiN layer can also serve as local interconnections for the peripheral circuits on the SRAM device. Preferably TiN layer 28 is patterned using RIE or a high plasma density etcher using a reactant gas such as sulfur hexafluoride ($SF_6$) or carbon tetrafluoride ($CF_4$).

Figure 5:
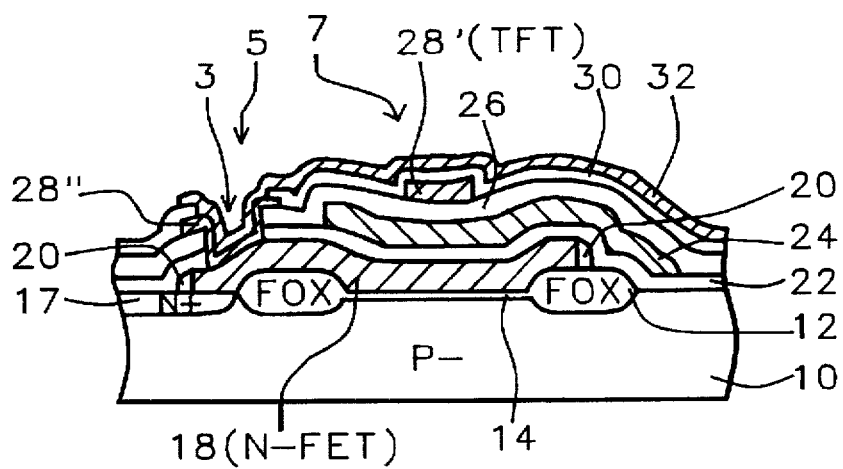

Referring now to FIG. 5, a blanket third insulating layer 30 is deposited over the TiN gate electrodes 28' to form a gate oxide, also labeled 30. Preferably the gate oxide is composed of $SiO_2$ and is deposited using a high temperature oxide deposition. For example, the gate oxide can be deposited by using LPCVD and reactant gases such as dichlorosilane ($SiH_2Cl_2$) and nitrous oxide ($N_2O$). Layer 30 is preferably deposited to a thickness of between about 200 and 500 Angstroms.

Still referring to FIG. 5, a photoresist mask and anisotropic plasma etching are used to form second contact openings 5 in the third insulating layer 30, aligned over portions 28" of the patterned conducting layer 28 which is over and in the first contact openings 3. The second contact openings 5 are selectively etched to the TiN layer 28, using, for example, RIE and a reactant gas such as sulfur hexafluoride ($SF_6$) or carbon tetrafluoride ($CF_4$).

Now as shown in FIG. 5, the P-channel regions for the TFTs, the $P^+$ source/drain regions and the electrical connection between the TFT-load and the storage node are now formed. The storage node contact is made via the contact to the gate electrode 18 of the N-channel FET. The process continues by depositing a third N-doped polysilicon layer 32 to a thickness of between about 200 and 500 Angstroms. Layer 32 is deposited using, for example, LPCVD and a reactant gas such as $SiH_4$. Layer 32 is preferably doped $N^{31}$ by ion implantation using phosphorus ions ($p^{31}$). The preferred concentration of $p^{31}$ after implantation is between about 1.0 E 14 and 1.0 E 16 ions/cm$^3$. The channel regions 7 over the TFT gate electrodes 28' are then masked with a patterned photoresist layer (not shown) and a $P^+$ ion implantation is carried out to provide for the TFT $P^+$ source/drain regions and interconnection to the N-channel FET gate electrode 18. Preferably the $P^+$ implant is carried out using boron ions ($B^{11}$), and after implantation the boron concentration is between about 1.0 E 18 and 1.0 E 21 atoms/cm$^3$.

Still referring to FIG. 5, using conventional photolithographic techniques and anisotropic plasma etching, the third polysilicon layer 32 is patterned to form the TFT $N^-$ doped channel regions over the TFT gate electrodes 28' and the $P^+$ source/drain regions. The patterned $P^+$ polysilicon layer 32 also extends over the second contact openings 5 contacting the portion of the TiN layer in the first contact openings 3. The $P^+$ layer 32 also forms a low-resistance ohmic contact to the TiN layer 28", thereby completing the contact between the TFT-load and the storage node in the TFT-load SRAM cell without P/N junctions.

Figure 6:
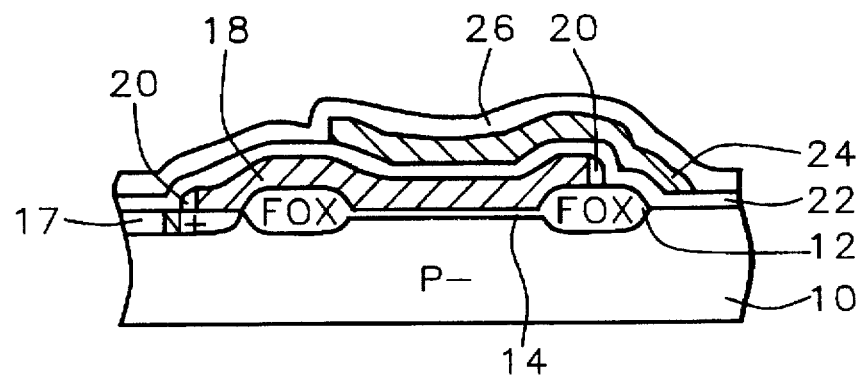
FIGS. 6 through 10 show the process sequence in schematic cross sectional view for building an improved SRAM cell by a second embodiment having a P-channel thin film transistor gate electrode formed from a titanium silicide ($TiSi_2$). Portions of the $TiSi_2$ also modify the P/N junction between the TFT-load and storage node of the TFT SRAM cell to form an ohmic contact.
Figure 7:
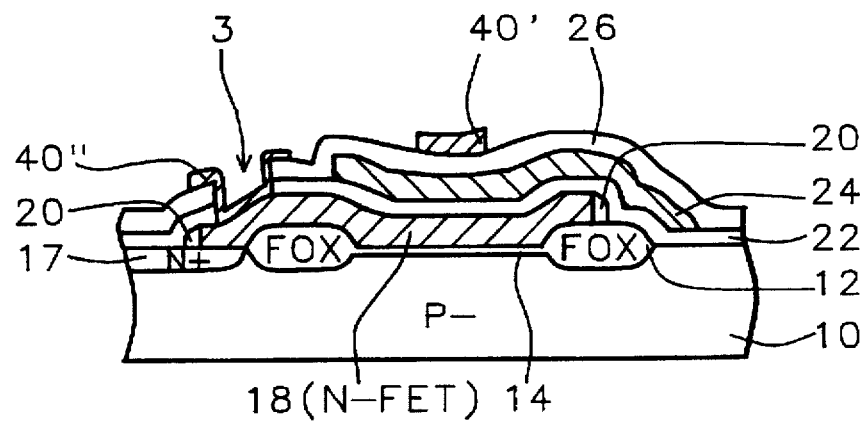

Referring to FIGS. 6 through 10, a second embodiment of the invention is now described. The process steps for this second embodiment are identical to the first embodiment up to and including depositing the second insulating layer 26, as shown in FIG. 6, and identical to FIG. 2. The similar structure elements for both embodiments are identically labeled.

The major difference between the first and second embodiments is the method for forming the TFT gate electrodes and the portions of the conducting layer in the first contact openings. More specifically, referring to FIG. 7, after etching the first contact openings 3, similar to the etching of the first contact openings in the first embodiment, a third undoped polysilicon layer 40 is conformally deposited over the second insulating layer 26, and patterned. For example, layer 40 can be deposited by LPCVD using a reactant gas such as silane ($SiH_4$). Layer 40 is deposited to a preferred thickness of between about 200 and 1000 Angstroms. Layer 40 is patterned using a photoresist mask and anisotropically plasma etched to form the gate electrodes 40' for the TFT, and to form portions 40" of polysilicon layer 40 over and in the first contact openings 3 contacting the first polysilicon layer 18 that forms the gate electrode 18 for the N-channel FET.

Figure 8:
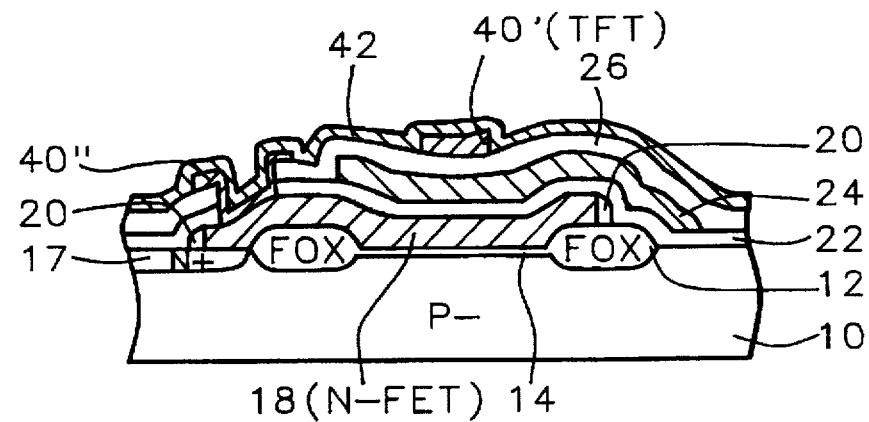

Referring now to FIG. 8, a metal layer 42, preferably composed of Ti, is deposited over the patterned portions 40" and 40' of the third polysilicon layer 40. Preferably layer 42 is sufficiently thick to completely convert the underlying patterned polysilicon layer 40 to a silicide during subsequent annealing. More specifically, for the thickness of polysilicon layer 40 cited above, the thickness of the Ti layer 42 should be between about 200 and 1000 Angstroms. The substrate 10 is now annealed in a temperature range of between about 600° and 750° C. using rapid thermal anneal (RTA) for a time greater than 30 seconds to form the silicide.

Figure 9:
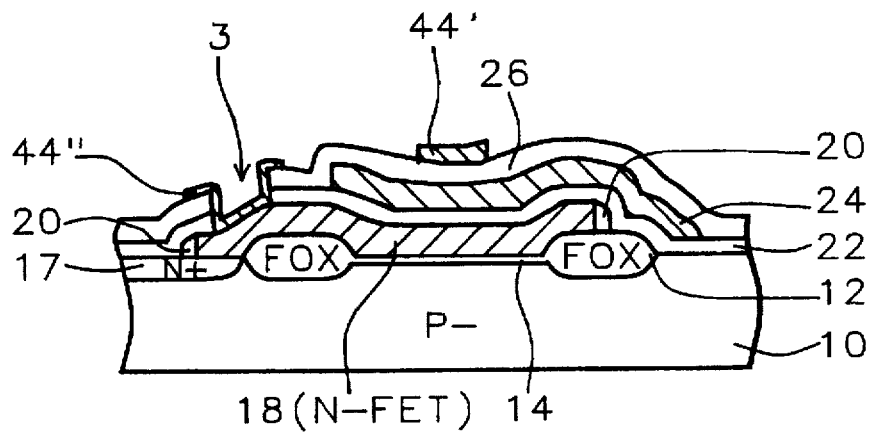

Similar to the Self-ALigned silICIDE (SALICIDE) process commonly used in the industry, the unreacted metal (Ti) over the second insulating layer 26 is then selectively removed by wet etching. This results in a patterned $TiSi_2$ layer forming the TFT gate electrodes 44' and also forming portions of the $TiSi_2$ layer 44" over the first contact openings 3, as shown in FIG. 9. Preferably the etching is carried out at room temperature in a mixture of DI $H_2O$, 30% $H_2O_2$ (hydrogen peroxide), and $NH_4OH$ (5:1:1). The wet etch also prevents residue that would otherwise occur using a dry etch because of the topography issue relating to the TFT gate electrode. The silicide can then be further annealed at a second temperature of about 800° C. in argon (Ar) to further lower the $TiSi_2$ sheet resistance and stabilize the $TiSi_2$ phase.

Figure 10:
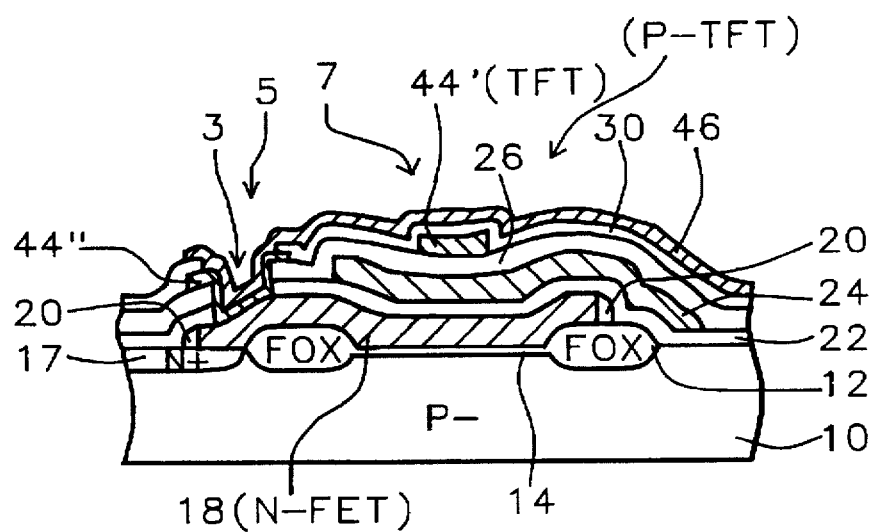

Referring now to FIG. 10, the TFT and the interconnecting ohmic contact are completed in a fashion identical to the first embodiment. A blanket third insulating layer 30 is deposited over the $TiSi_2$ gate electrodes 44' to form a gate oxide, also labeled 30. The gate oxide in this embodiment is also composed of $SiO_2$ and is deposited using CVD, and is preferably deposited to a thickness of between about 200 and 500 Angstroms. Also as shown in FIG. 10, a photoresist mask and anisotropic plasma etching are used to form second contact openings 5 in the third insulating layer 30, aligned over portions 44" which are over and in the first contact openings 3. The second contact openings 5 are selectively etched to the portions of the $TiSi_2$ layer 44" using, for example, RIE and a reactant gas such as $CF_4$. A fourth $N^-$ doped polysilicon layer 46 is deposited to a thickness of between about 200 and 1000 Angstroms over the gate oxide 30. Layer 46 is preferably doped $N^-$ by ion implantation using phosphorus ions ($p^{31}$). The preferred concentration of $p^{31}$ after implantation is between about 1.0 E 14 and 1.0 E 16 ions/cm$^3$. The channel regions 7 over the TFT gate electrodes 44' are then masked with a patterned photoresist layer (not shown), and a $P^+$ ion implantation is carried out to provide for the TFT $P^+$ source/drain region and interconnection to the N-channel FET gate electrode 18.

Preferably the $P^+$ implant is carried out using boron ions ($B^{11}$), and after implantation the boron concentration in layer 46 is between about 1.0 E 18 and 1.0 E 21 atoms/cm$^3$. Conventional photolithographic techniques and anisotropic plasma etching are used to pattern the fourth polysilicon layer 46 to form the TFT $N^-$ doped channel regions over the TFT gate electrodes 44' and the $P^+$ source/drain regions. The patterned $P^+$ polysilicon layer 46 also extends over the second contact openings 5 contacting the portion of the TiSi$_2$ layer 44" in the first contact openings 3. The $P^+$ portion of layer 46 also forms a low-resistance ohmic contact to the TiSi$_2$ layer 44", thereby completing the contact between the TFT-load and the storage node in the TFT-load SRAM cell without P/N junctions.

While the invention has been particularly shown and described with reference to the preferred embodiments thereof, it will be understood by those skilled in the art that various changes in form and details may be made without departing from the spirit and scope of the invention.

What is claimed is:

1. A method for making concurrently P-channel thin-film-transistor (TFT) gate electrodes and modifying P/N junctions at contacts to form ohmic contacts for TFT-static random access memory cells comprising the steps of:

providing a semiconductor substrate having field effect transistors (FETs) formed on said substrate surface, said FETs having gate electrodes formed from a patterned $N^+$ doped first polysilicon layer;

depositing a blanket first insulating layer on said gate electrodes;

depositing a second polysilicon layer on said first insulating layer;

patterning said second polysilicon layer by photoresist masking and plasma etching to provide electrically conducting patterns for said SRAM cells;

depositing a second insulating layer on said patterned second polysilicon layer and elsewhere on said first insulating layer;

anisotropically and selectively etching first contact openings in said second and first insulating layers using a photoresist mask, said selective etching stopping at portions of said gate electrodes formed from said $N^+$ doped first polysilicon layer;

depositing a blanket electrically conducting layer on said second insulating layer and in said first contact openings;

patterning said conducting layer and thereby forming gate electrodes for said P-channel thin film transistors and further leaving portions of said blanket conducting layer in said first contact openings thereby forming ohmic contacts to said $N^+$ first polysilicon layer;

depositing on said patterned conducting layer a blanket third insulating layer thereby forming a gate oxide on said gate electrodes of said P-channel TFTs;

photoresist masking and anisotropically plasma etching second contact openings in said third insulating layer aligned over portions of said patterned conducting layer over and in said first contact openings;

depositing an $N^-$ doped third polysilicon layer over said gate oxide and in said second contact openings;

doping selectively with P-type dopant said $N^-$ doped third polysilicon layer while leaving undoped portions over said P-channel TFT gate electrode areas and thereby forming TFT source/drain areas;

patterning said doped third polysilicon layer and thereby forming TFT channel regions over said thin film gate electrodes and furthermore having portions extending to and over said conductive layer in said first contact openings and thereby forming ohmic contacts in said second and first contact openings to said first polysilicon layer thereby completing said thin film transistors and said ohmic contacts for said SRAM cells.

2. The method of claim 1, wherein said first polysilicon layer forms the gate electrodes of the FETs on the substrate for the driver transistors on said SRAM.

3. The method of claim 1, wherein said first polysilicon layer is doped $N^+$ with arsenic (As) to a concentration of between about 1.0 E 18 and 1.0 E 21 atoms/cm$^3$.

4. The method of claim 1, wherein said first polysilicon layer is deposited to a thickness of between about 1000 and 3500 Angstroms.

5. The method of claim 1, wherein said first insulating layer is silicon oxide (SiO$_2$) and is deposited to a thickness of between about 1000 and 3000 Angstroms.

6. The method of claim 1, wherein said second insulating layer is SiO$_2$ and is deposited to a thickness of between 1000 and 2500 Angstroms.

7. The method of claim 1, wherein said conducting layer is titanium nitride (TiN) and is deposited to a thickness of between about 400 and 1000 Angstroms.

8. The method of claim 1, wherein said conducting layer is titanium silicide (TiSi$_2$) and is deposited to a thickness of between about 200 and 1000 Angstroms.

9. The method of claim 1, wherein said third insulating layer forming said P-channel thin-film-transistor gate oxide is SiO$_2$ deposited by high temperature chemical vapor deposition (CVD).

10. The method of claim 9, wherein said gate oxide is deposited to a thickness of between about 200 and 500 Angstroms.

11. The method of claim 1, wherein said third polysilicon layer has a thickness of between about 200 and 500 Angstroms.

12. The method of claim 1, wherein said third polysilicon layer is selectively doped P-type with boron having a dopant concentration of between about 1.0 E 18 and 1.0 E 21 atoms/cm$^3$.

13. The method of claim 1, wherein said ohmic contacts are formed between thin-film-transistor loads and storage nodes of said TFT SRAM cells.

14. A method for making concurrently P-channel thin-film-transistor (TFT) gate electrodes and modifying P/N junctions at contacts to form ohmic contacts for TFT-static random access memory cells comprising the steps of:

providing a semiconductor substrate having field effect transistors (FETs) formed on said substrate surface, said FETs having gate electrodes formed from a patterned $N^+$ doped first polysilicon layer;

depositing a blanket first insulating layer on said gate electrodes;

depositing a conductively doped second polysilicon layer on said first insulating layer;

patterning said second polysilicon layer by photoresist masking and plasma etching to provide electrically conducting patterns for said SRAM cells;

depositing a second insulating layer on said patterned second polysilicon layer and elsewhere on said first insulating layer;

anisotropically and selectively etching first contact openings in said second and first insulating layers using a photoresist mask, said selective etching stopping at portions of said gate electrodes formed from said $N^+$ doped first polysilicon layer;

depositing a blanket third polysilicon layer on said second insulating layer and in said first contact openings;

patterning said third polysilicon layer over regions where gate electrodes for said P-channel thin film transistors are desired and further leaving portions of said third polysilicon layer in said first contact openings;

depositing a blanket metal layer on said patterned third polysilicon layer and elsewhere on said substrate;

annealing said substrate and forming a metal silicide from said metal layer and said patterned third polysilicon layer while leaving unreacted said metal layer on said second insulating layer;

wet etching and completely removing said unreacted metal layer thereby forming gate electrodes for said P-channel thin film transistors and further leaving portions of said silicide layer in said first contact openings thereby forming ohmic contacts to said $N^+$ doped first polysilicon layer;

depositing on said patterned silicide layer a blanket third insulating layer thereby forming a gate oxide on said gate electrodes of said P-channel TFTs;

photoresist masking and anisotropically plasma etching second contact openings in said third insulating layer aligned over portions of said patterned silicide layer over and in said first contact openings;

depositing an $N^-$ doped fourth polysilicon layer over said gate oxide and in said second contact openings;

doping selectively with P-type dopant said $N^-$ doped fourth polysilicon layer while leaving undoped portions over said P-channel TFT gate electrode areas and thereby forming TFT source/drain areas;

patterning said doped fourth polysilicon layer and thereby forming TFT channel regions over said thin film gate electrodes and furthermore having portions extending to and over said silicide layer in said first contact openings and thereby forming ohmic contacts in said second and first contact openings to said first polysilicon layer, and completing said thin film transistors and said ohmic contacts for said SRAM cells.

15. The method of claim 14, wherein said first polysilicon layer forms the gate electrodes of the FETs on the substrate for the driver transistors on said SRAM.

16. The method of claim 14, wherein said first polysilicon layer is doped $N^+$ with arsenic (As) to a concentration of between about 1.0 E 18 and 1.0 E 21 atoms/cm$^3$.

17. The method of claim 14, wherein said first polysilicon layer is deposited to a thickness of between about 1000 and 3500 Angstroms.

18. The method of claim 14, wherein said first insulating layer is silicon oxide ($SiO_2$) and is deposited to a thickness of between about 1000 and 3000 Angstroms.

19. The method of claim 14, wherein said second insulating layer is $SiO_2$ and is deposited to a thickness of between 1000 and 2500 Angstroms.

20. The method of claim 14, wherein said third polysilicon layer is deposited to a thickness of between about 200 and 500 Angstroms.

21. The method of claim 14, wherein said metal layer is titanium (Ti) and is deposited to a thickness of between about 200 and 1000 Angstroms.

22. The method of claim 14, wherein said silicide layer is titanium silicide ($TiSi_2$) and has a thickness of between about 200 and 1000 Angstroms.

23. The method of claim 14, wherein said third insulating layer forming said P-channel thin-film-transistor gate oxide is $SiO_2$ deposited by chemical vapor deposition (CVD).

24. The method of claim 23, wherein said gate oxide is deposited to a thickness of between about 200 and 500 Angstroms.

25. The method of claim 14, wherein said fourth polysilicon layer has a thickness of between about 200 and 500 Angstroms.

26. The method of claim 14, wherein said fourth polysilicon layer is doped P-type with boron having a dopant concentration of between about 1.0 E 18 and 1.0 E 21 atoms/cm$^3$.

27. The method of claim 14, wherein said ohmic contacts are formed between thin-film-transistor-loads and storage nodes of said TFT SRAM cells.

\* \* \* \* \*